United States Patent
Oeschler

(10) Patent No.: US 10,020,278 B2
(45) Date of Patent: Jul. 10, 2018

(54) METHOD FOR POSITIONING A SEMICONDUCTOR CHIP ON A CARRIER AND METHOD FOR MATERIAL-FIT BONDING OF A SEMICONDUCTOR CHIP TO A CARRIER

(71) Applicant: Infineon Technologies AG, Neubiberg (DE)

(72) Inventor: Niels Oeschler, Moehnesee (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/217,199

(22) Filed: Jul. 22, 2016

(65) Prior Publication Data
US 2017/0025373 A1    Jan. 26, 2017

(30) Foreign Application Priority Data
Jul. 23, 2015  (DE) .................. 10 2015 112 023

(51) Int. Cl.
*H01L 23/00* (2006.01)

(52) U.S. Cl.
CPC .............. *H01L 24/27* (2013.01); *H01L 24/75* (2013.01); *H01L 24/83* (2013.01); *H01L 2224/27848* (2013.01); *H01L 2224/83201* (2013.01); *H01L 2224/83801* (2013.01)

(58) Field of Classification Search
None
See application file for complete search history.

(56) References Cited

U.S. PATENT DOCUMENTS

| 2008/0135959 A1* | 6/2008 | Theuss ............... G01R 33/0005 |
| | | 257/427 |
| 2010/0055839 A1 | 3/2010 | Nikitin |
| 2012/0306087 A1* | 12/2012 | Bayerer .................. H01L 23/15 |
| | | 257/772 |

FOREIGN PATENT DOCUMENTS

| CN | 1273694 A | 11/2000 |
| CN | 101689516 A | 3/2010 |
| CN | 103579030 B | 1/2016 |
| DE | 102007036044 A1 | 2/2009 |

\* cited by examiner

*Primary Examiner* — Robert Bachner
(74) *Attorney, Agent, or Firm* — Murphy, Bilak & Homiller, PLLC

(57) ABSTRACT

A semiconductor chip includes a semiconductor body having a bottom side and a top side opposite the bottom side, and passivation arranged on the top side. The semiconductor chip is positioned on the carrier by picking the semiconductor chip and placing the semiconductor chip on the carrier, and pressing the semiconductor chip onto the carrier by a pressing force in a pressing direction, such that the pressing force acts on the semiconductor chip only above one or more continuous chip metallization sections arranged on the top side. Each of the one or more continuous chip metallization sections includes an annularly closed edge section which has a minimum width of more than zero in each direction perpendicular to the pressing direction. The pressing force does not act on the semiconductor chip above any of the edge sections.

20 Claims, 8 Drawing Sheets

METHOD FOR POSITIONING A SEMICONDUCTOR CHIP ON A CARRIER AND METHOD FOR MATERIAL-FIT BONDING OF A SEMICONDUCTOR CHIP TO A CARRIER

PRIORITY CLAIM

This application claims priority to German Patent Application No. 10 2015 112 023.2 filed on 23 Jul. 2015, the content of said application incorporated herein by reference in its entirety.

TECHNICAL FIELD

The present invention relates to a method for positioning a semiconductor chip on a carrier, and to a method for the bonding of a semiconductor chip to a carrier.

BACKGROUND

In order to mount a semiconductor chip on a carrier, it may also be necessary for the semiconductor chip to be pressed against the carrier. For example, during the production of diffusion-soldered or sintered bonds (for example with the low-temperature bonding "LTB" technique) between a semiconductor chip and a carrier, but also when using other bonding technologies, particularly highly reliable semiconducting modules can be produced when the pressing is carried out with a specific minimum pressing force.

During pressing, however, the risk arises that the application tool may damage a passivation layer of the semiconductor chip, so that in the course of time moisture can reach the semiconductor body of the semiconductor chip. Furthermore, such damage may degrade the dielectric strength of the semiconductor chip. On the other hand, it is desirable to press as large as possible a region of the semiconductor chip onto the carrier, in order to achieve an extensive high-quality bond. This is advantageous for example during the production of power semiconductor modules, since in this case power semiconductor chips having very large base areas are used as semiconductor chips.

SUMMARY

The object of the present invention is to provide a method for positioning a semiconductor chip on a carrier, and a method for bonding a semiconductor chip to a carrier.

A first aspect relates to a method for positioning a semiconductor chip on a carrier. The semiconductor chip comprises a semiconductor body having a bottom side and a top side opposite the bottom side, and passivation which is arranged on the top side. During the process, the semiconductor chip is picked and placed on the carrier. By a pressing force, the semiconductor chip is pressed onto the carrier in such a way that the pressing force acts on the semiconductor chip only above one or more continuous chip metallization sections arranged on the top side, each of these continuous chip metallization sections comprising an annularly closed edge section which has a minimum width of more than zero in each direction perpendicular to the pressing direction, and the pressing force not acting on the semiconductor chip above any of the edge sections.

A second aspect relates to a method in which a method according to the first aspect is used for the bonding of a semiconductor chip to a carrier. To this end, by a method according to the first aspect, a semiconductor chip is positioned on a carrier and pressed onto the carrier. In this case, the placement of the semiconductor chip on the carrier is carried out in such a way that a bonding agent layer is arranged between the bottom side and the carrier after the placement and during the pressing.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

DETAILED DESCRIPTION

Figure 1A:
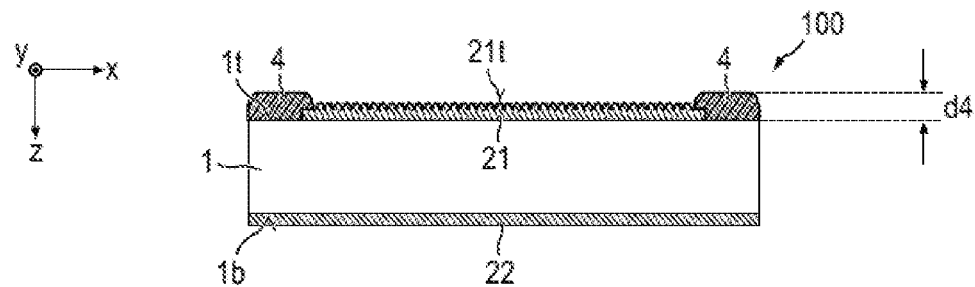
FIG. 1A shows a cross section through a semiconductor chip.

FIG. 1A shows a semiconductor chip 100 in cross section. The semiconductor chip 100 may be any desired semiconductor component, for example a MOSFET (metal oxide semiconductor field-effect transistor), an IGBT (insulated gate bipolar transistor), a JFET (junction field-effect transistor), an HEMT (high electron mobility transistor), a thyristor or a diode.

The semiconductor chip 100 has a semiconductor body 1 which comprises a top side 1*t* and a bottom side 1*b* opposite the top side. A continuous chip metallization section 21, having a top side 21*t* facing away from the semiconductor body 1, is applied onto the top side 1*t*. Furthermore, the chip metallization section 21 comprises a circumferential edge 21*s* which is fully covered circumferentially by dielectric passivation 4, for example an imide or a polyimide or another suitable passivation dielectric. The passivation 4 may for example have a thickness d4 of at least 10 µm, for example in the range of from 10 µm to 100 µm. Furthermore, optionally, as represented, a lower chip metallization 22 may be applied onto the bottom side 1*b* of the semiconductor body 1.

Figure 1B:
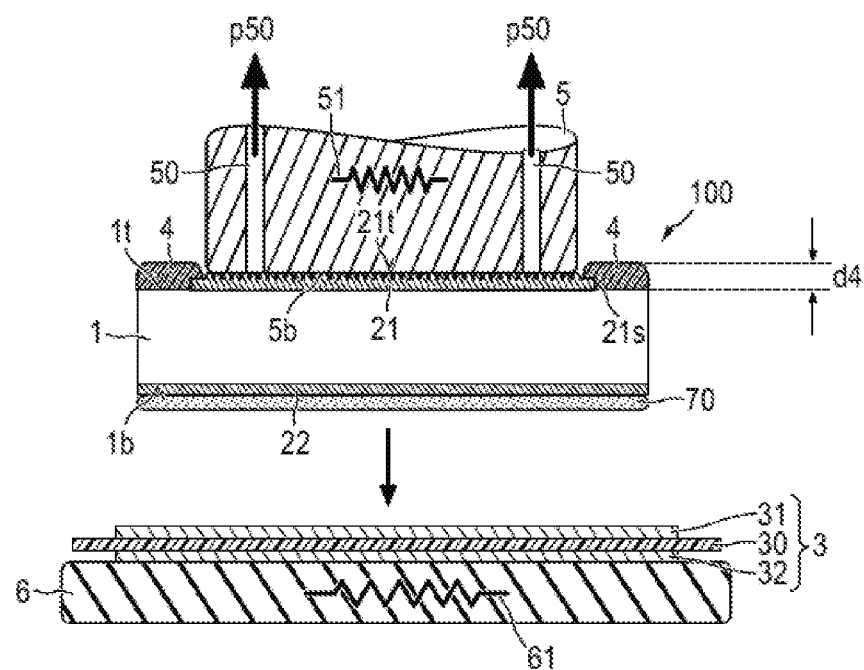
FIG. 1B shows the semiconductor chip according to FIG. 1A, held by an application tool, during the placement of the semiconductor chip on a carrier.

As is shown in FIG. 1B, the semiconductor chip 100 according to FIG. 1A may be picked by an application tool 5 (for example a pick-and-place tool) and, the result of which being represented in FIG. 1O, placed on a carrier 3 and pressed against the carrier 3 by the application tool 5.

The carrier 3 may in principle be any desired carrier, for example a lead frame or a circuit board. Merely by way of example, the carrier 3 represented is configured as a ceramic substrate, i.e. as a circuit board having a ceramic insulation carrier. In principle, however, the invention may be carried out with other carriers.

The carrier 3 comprises a dielectric insulation carrier 30, which is provided on mutually opposite sides with an upper metallization layer 31 and with a lower metallization layer 32, respectively. The insulation carrier 30 consists of an electrically insulating ceramic, for example aluminum oxide ($Al_2O_3$), aluminum nitride (AlN), beryllium oxide (BeO), zirconium oxide ($ZrO_2$), silicon nitride ($Si_3N_4$).

In order to pick the semiconductor chip 100 and hold it at least until placement on the carrier 3, the application tool 5 may comprise one or more suction channels 52 to which—relative to the ambient pressure of the atmosphere surrounding the semiconductor chip 100 and the application tool 5—a reduced pressure p50 can be applied so that the semiconductor chip 100 is so to speak sucked onto the bottom side 5*b* of the application tool 5. As represented in FIG. 1B, the semiconductor chip 100 held by the application tool 5 in the manner explained, or in any other desired manner, may be placed on a carrier 3 and pressed against the carrier 3 by an application pressure F5. The pressing of the semiconductor chip 100 against the carrier 3 may likewise be carried out with the aid of the application tool 5. The pressure force F5 may, for example, be at least 1 N or even at least 5 N.

During the pressing, the application tool 5 may optionally touch the chip metallization section 21 directly, i.e. the distance a between the application tool 5 and the chip metallization section 21 may be equal to zero.

The placement of the semiconductor chip 100 on the carrier 3 may be used in order to bond the semiconductor chip 100 to the carrier 3 with a material fit. To this end, before the placement of the semiconductor chip 100 on the carrier 3, a bonding agent layer 70 is introduced between the semiconductor chip 100 and the carrier 3. For example, as shown in FIG. 1B, the bonding agent layer 70 may be applied onto the lower chip metallization 22 before the semiconductor chip 100 provided with the bonding agent layer 70 is placed on the carrier 3. As an alternative, the bonding agent layer 70 could also be applied onto the carrier 3 before the semiconductor chip 100 is placed on the bonding agent layer 70 applied on the carrier 3. As a further alternative, a bonding agent layer 70 could be applied onto the lower chip metallization 22 and a further bonding agent layer 70 could be applied onto the carrier 3, before the semiconductor chip 100 with the bonding agent layer 70 located thereon is placed on the further bonding agent layer 70 applied onto the carrier 3, so that the bonding agent layer 70 and the further bonding agent layer 70 are combined to form a single bonding agent layer.

After the placement of the semiconductor chip 100 on the carrier 3 and while the semiconductor chip 100 is being pressed onto the carrier 3—if a material-fit bond is intended to be produced between the semiconductor chip 100 and the carrier 3—a bonding agent layer 70 may be applied between the semiconductor chip 100 and the carrier 3. This bonding agent layer 70 extends continuously between the semiconductor chip 100 and the carrier 3.

The bonding agent layer 70 may for example consist of or contain a solder, in particular a diffusion solder, or it may contain or consist of a dried metal powder, in particular a silver powder. Likewise, however, it is possible to use an adhesive layer as the bonding agent layer, for example consisting of an electrically conductive or electrically insulating adhesive. If not only a material-fit bond but also an electrically conductive bond is intended to be produced between the semiconductor chip 100 and the carrier 3, the bonding agent layer 70 is preferably electrically conductive.

Figure 1C:
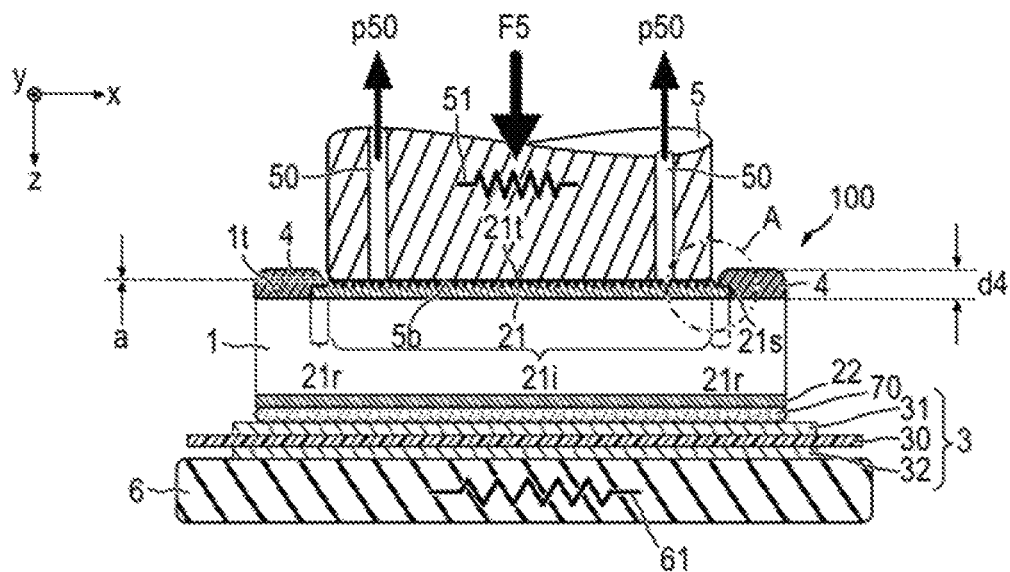
FIG. 1C shows the semiconductor chip according to FIGS. 1A and 1B while it is being pressed onto the carrier by the application tool in order to bond it to the carrier.
Figure 1D:
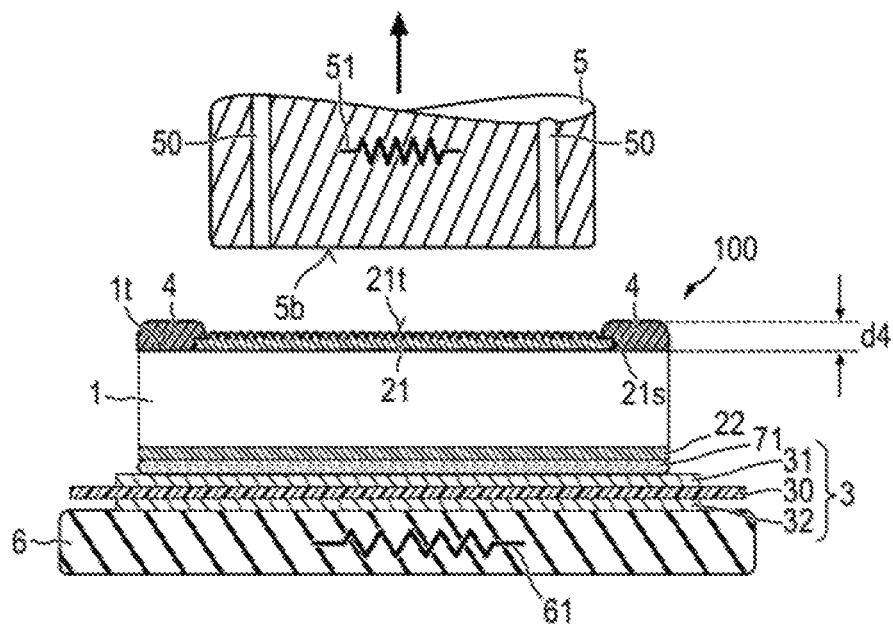
FIG. 1D shows the semiconductor chip bonded to the carrier, after the removal of the application tool.

During the production of the material-fit bond, the bonding agent layer 70 is converted into a bonding layer 71, which bonds the semiconductor chip 100 to the carrier 3 firmly with a material fit, which is shown in FIG. 1D. After production of this bond, the application tool 5 may be removed from the semiconductor chip 100 bonded to the carrier 3, as shown in FIG. 1D. To this end, the reduced pressure p50 is released from the one or more suction channels 50, so that the reduced pressure p50 prevailing therein increases approximately to the ambient pressure.

As is furthermore revealed by FIGS. 1B to 1D, the pressing of the semiconductor chip 100 onto the carrier 3 may be carried out in such a way that the semiconductor chip 100 and the carrier 3, and optionally a bonding agent layer 70 lying between them, are clamped between the application tool 5 and a backing holder 6, which lies on the side of the carrier 3 facing away from the application tool 5. The carrier 3 may for example bear loosely on the backing holder 6, or it may be fixed thereon in any desired way.

Optionally the application tool 5 and/or the backing holder 6 may comprise an integrated heater 51 or 61, respectively, by means of which heat can be supplied to the bonding agent layer 70 during the pressing (FIG. 1O) in order to accelerate the bonding process. Of course, the heaters 51 and/or 61 may also be present when the semiconductor chip 100 is placed on the carrier 3 without producing a material-fit bond thereto, since the heaters 51, 61 do not necessarily have to be activated.

With the aid of heaters 51 and/or 61, the bonding agent layer 70 may be heated to process temperatures suitable for the bonding process; when the bonding agent layer 70 comprises for example a solder, it may be heated during the pressing to temperatures which are higher than the temperature at which the solder melts. When the bonding agent layer 70 comprises for example a metal powder, for example a silver powder, it may be heated during the pressing to temperatures which are higher than the temperature at which the metal powder is sintered (for example to at least 100° C.).

The question of the times at which the heaters 51, 61 (if present) are activated, and the temperatures which are thereby generated, is in principle arbitrary. According to one example, the semiconductor chip 100 may be provided as represented in FIG. 1B with the bonding agent layer 70 before placement on the carrier 3. The heater 51 of the application tool 5 may in this case be deactivated. The carrier 3 may be preheated by the heater 61 of the backing holder 6 before the semiconductor chip 100 provided with the bonding agent layer 70 is placed on the carrier 3. The temperature to which the carrier 3 is preheated may be significantly higher (for example by at least 100° C.) than the temperature which the bonding agent layer 70 located on the semiconductor chip 100 is at before the placement. In this way, the bonding agent layer 70 may be heated significantly from the time of the placement onward. In order to maintain or increase the heat input into the bonding agent layer 70, from the time of the placement onward the heater 61 may remain activated or be reactivated, and/or the heater 51 may be activated.

In the aforementioned example, heating of the bonding agent layer 70 is only carried out after the placement. In this way, for example, it is possible that in the case of a metal powder to be sintered, contained in the bonding agent layer 70, the sintering process already begins before the placement, which would be detrimental to the quality of the bond to be produced. However, heating of the bonding agent layer 70 only after the placement may be carried out not only in the case of sintered bonds to be produced, but also in the case of any other desired bonding techniques.

If the bonding agent layer 70 comprises a solder or consists of a solder, it may be heated by activation of the heaters 51 and/or 61 during the pressing to temperatures which are higher than the melting point of the solder. In this way, the solder melts. Subsequently, while maintaining the pressing force, the temperature may be reduced again at least until the molten solder solidifies to such an extent that there is a solid bonding layer 71. The parameters of pressing force, temperature of the bonding agent layer and pressing time, selected during the pressing, may in this case be selected in such a way that not just a simple solder layer (which is likewise possible) but a diffusion solder layer is formed from the bonding agent layer 70.

As is shown in FIG. 10, the pressing force F5 may act in a direction z. This direction will also be referred to below as the "pressing direction". In order to prevent the passivation 4 lying on the lateral edge 21s of a chip metallization section 21 from being damaged by the application tool 5 during the pressing, the geometry on the bottom side 5b of the application tool 5 is configured in such a way that it presses on the semiconductor chip 100 only above (i.e. counter to the pressing direction z) an inner region 21i of the chip metallization section 21, but not above an annularly closed edge section of the chip metallization section 21. This will be explained in more detail below with reference to FIG. 2, which shows an enlarged section A of the arrangement according to FIG. 1C.

As is schematically represented in FIGS. 1A-1D and 2, the top side 21t, facing away from the semiconductor body 1, of a continuous chip metallization section 21 applied onto the top side 1t of the semiconductor body 1 need not necessarily be planar. For example, as can be clearly seen particularly in FIG. 2, it may have a structure, as may be the case for example with source or emitter metallizations of a MOSFET or IGBT or another transistor component, which has a cell structure of transistor cells electrically connected in parallel with one another. Such a nonplanar top side 21t of a chip metallization section 21 may, for example, be due to a component structure lying below the metallization section 21 being replicated on the top side it of the semiconductor body 1. In this context, it is to be pointed out that such structures are not represented in the present figures.

Figure 2:
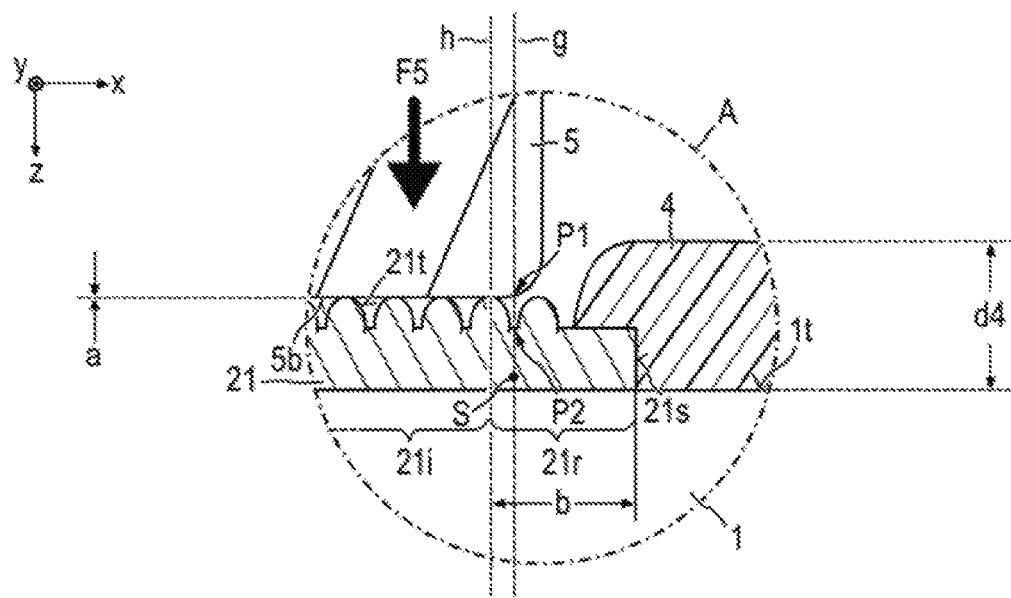
FIG. 2 shows an enlarged section A of the arrangement according to FIG. 1C during the pressing of the semiconductor chip onto the carrier.

As is represented in FIG. 2, the chip metallization section 21 has an edge section 21r. This, as already explained, is annularly closed. In each direction perpendicular to the pressing direction z, for example the x and y directions represented, but also in any other direction that can be represented in the x-y plane, the edge section 21r has a minimum width b of more than zero. This minimum width b may, for example, be equal to 100 μm or even equal to 200 μm in each direction perpendicular to the pressing direction z. Expressed simply, at no position S of the edge section 21r is a pressing force, coming from the application tool 5, transmitted along a continuous straight path extending parallel to the pressing direction z during the pressing.

Expressed another way, for each position S of the annularly closed edge section 21r, during the pressing a straight line g which extends through this position S in the pressing direction z comprises a portion [P1; P2] which does not extend through a solid body. Because the portion [P1; P2] does not extend through a solid body, there is no pressing force transmitted in a straight line in the pressing direction z onto the position S, i.e. no pressing force transmitted continuously along the straight line g between the application tool 5 and the position S. In this way, the occurrence of an undesirably high application of force to the semiconductor chip 100 in the region of the edge section 21r is thus avoided during the pressing. In particular, the passivation 4 is therefore prevented from being loaded with pressure in its particularly sensitive regions above the edge section 21r, and thereby being damaged, for example by a pressing force which is too high and/or because the dirt particles lying on the passivation 4 are pressed into the passivation 4.

As can be seen in FIG. 2, the starting point P1 of the portion [P1; P2] lies where the straight line g extending parallel to the pressing direction z through the position S intersects the bottom side 5b of the application tool 5. The endpoint P2 of the portion [P1; P2] lies at the position where the straight line g intersects the top side 21t, facing away from the semiconductor body 1, the chip metallization section 21.

In the inner region 21, on the other hand, transmission of the pressing force in a straight line from the application tool 5 to the chip metallization section 21 is permissible. Such force transmission in a straight line is likewise represented in FIG. 2. A straight line h extends parallel to the pressing direction z through a position at which the bottom side 5b of the application tool 5 bears directly on the chip metallization section 21. At this position, the pressing force coming from the application tool 5 and acting in the pressing direction z is transmitted directly onto the chip metallization section 21. The same applies for other positions on the top side 21t of the chip metallization section 21, at which the bottom side 5t of the application tool 5 bears on the top side 21t of the chip metallization section 21.

Figure 3:
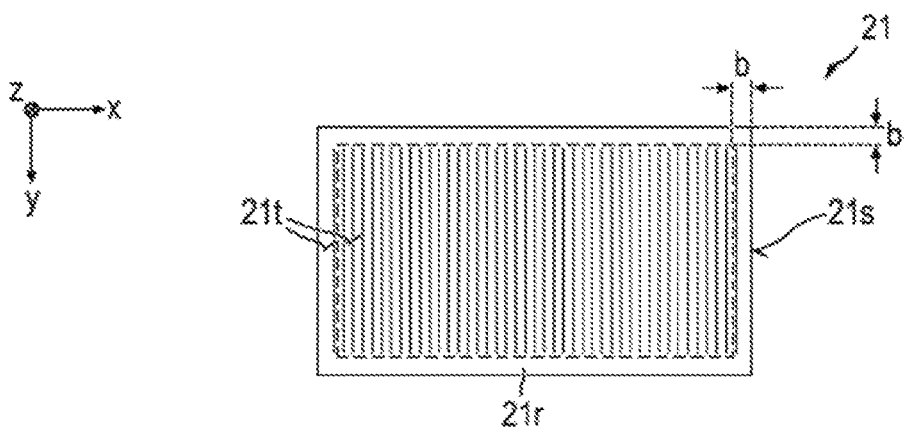
FIG. 3 shows a plan view of the chip metallization section which is applied onto the top side of the semiconductor body of the semiconductor chip according to FIG. 1A.

FIG. 3 shows a plan view of the chip metallization section 21 of the semiconductor chip 100 explained above with a view of the top side 21t. All other component parts of the semiconductor chip 100, in particular the passivation 4, are not shown. The dashed line represents the inner boundary of the edge section 21r.

Figure 4A:
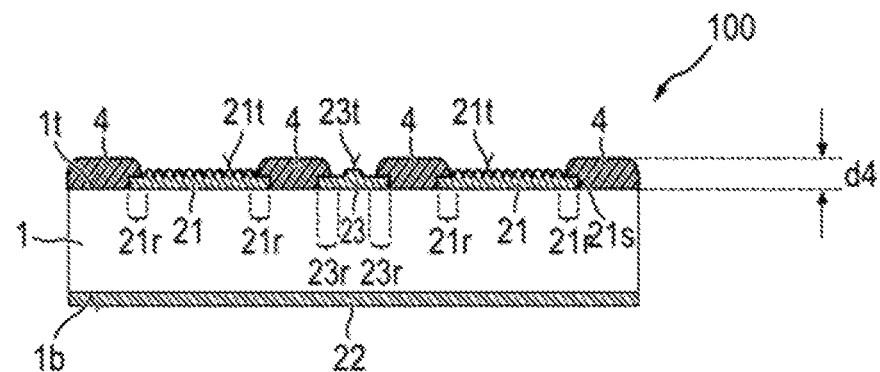
FIG. 4A shows a cross section through a semiconductor chip, which comprises a semiconductor body having a top side onto which a plurality of continuous chip metallization sections is applied.

FIG. 4A shows another example of a semiconductor chip 100. It comprises a plurality of continuous chip metallization sections 21, 23. One or more respective continuous chip metallization sections 21 (the reference 21 may thus denote two different chip metallization sections 21 separated from one another, or alternatively the same chip metallization section 21) may, for example be one or more source metallizations or one or more emitter metallizations. The chip metallization section 23 may for example be a gate metallization, for example a so-called gate runner or gate finger, or a gate pad used for external electrical contacting. The passivation 4 extends beyond the edge sections 21r, 23r of each of the continuous chip metallization sections 21 and 23, respectively.

The production of a bond between the semiconductor chip 100 according to FIG. 4A and a carrier 3 will be explained below with the aid of FIGS. 4B to 4D. The method is carried out as the method explained with the aid of FIGS. 1B to 1D, with the difference that the application tool 5 is constructed differently on its bottom side 5b. Specifically, the application tool 5 comprises on its bottom side 5b one or more recesses 55, in which sections of the passivation 4 engage while the semiconductor chip 100 is being held by the application tool 5 (FIG. 4B) and while the semiconductor chip 100 is being pressed against the carrier 3 by the application tool 5 (FIG. 4C). The recesses 55 are configured in such a way that a pressing force coming from the application tool 5 is transmitted along a straight portion extending parallel to the pressing direction z only on to such regions of the chip metallization sections 21, 23 which do not constitute a component part of an edge section 21r, 23r. The recesses 55 may be configured in such a way that the application tool 5 does not touch the passivation 4 during the pressing. The depth t55 of one or more such recesses 55 (measured parallel to the pressing direction z during the pressing) may, for example, be at least 0.3 mm. It may, for example, lie in the range of from 0.3 mm to 0.5 mm.

Figure 4B:
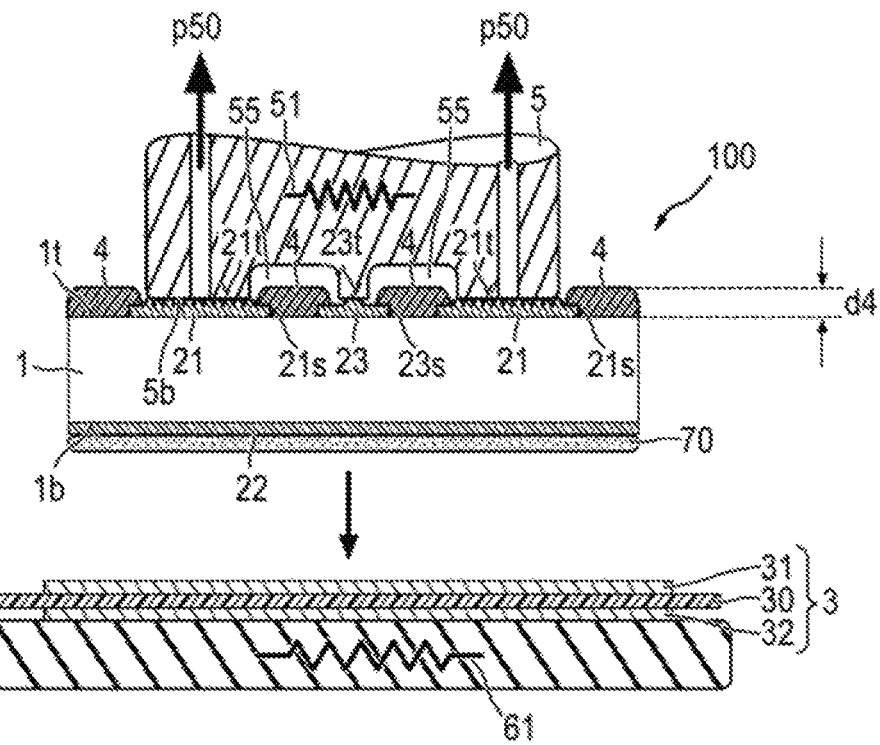
FIG. 4B shows the semiconductor chip according to FIG. 4A, held by an application tool, during the placement of the semiconductor chip on a carrier.
Figure 4C:
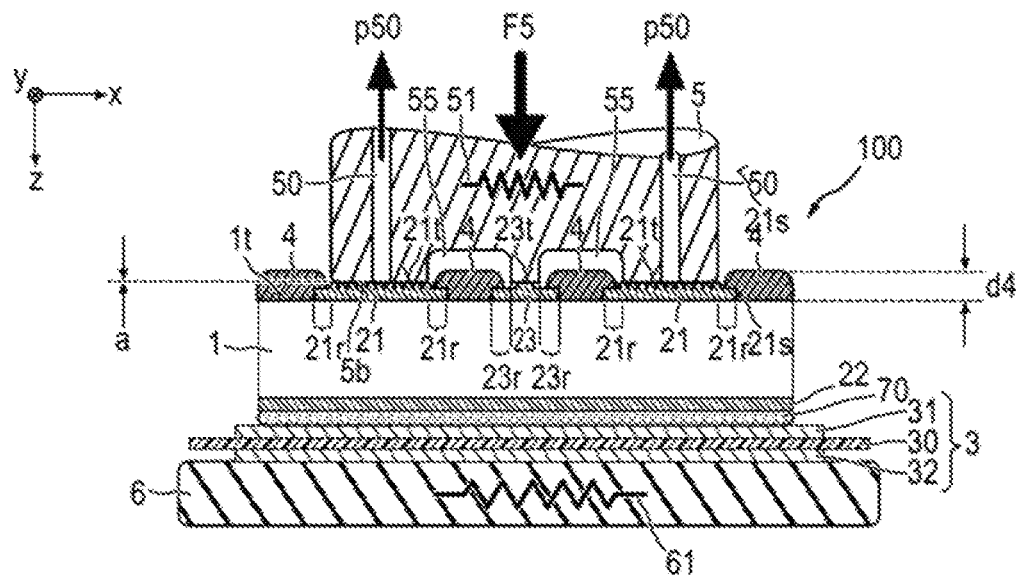
FIG. 4C shows the semiconductor chip of FIGS. 4A and 4B while it is being pressed onto the carrier by the application tool in order to bond it to the carrier.
Figure 4D:
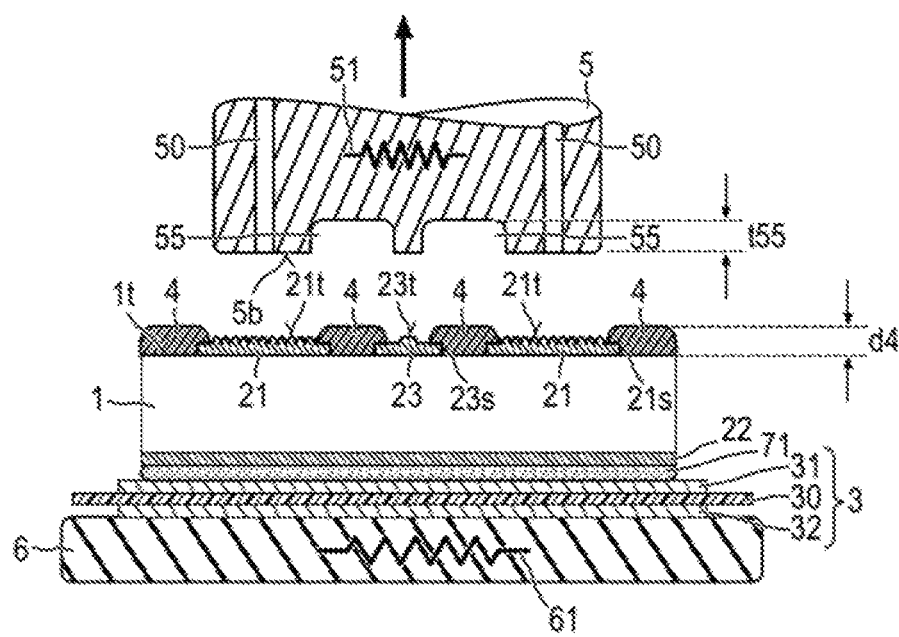
FIG. 4D shows the semiconductor chip bonded to the carrier, after the removal of the application tool.

In the examples according to FIGS. 4B to 4D, the pressing force is induced on the semiconductor chip 100 not only via the chip metallization section or sections 21, but also via the chip metallization section 23. During the pressing, the application tool 5 may touch the chip metallization sections 21 and 23 directly, i.e. the distance a between the application tool 5 and the chip metallization section 21 and between the application tool 5 and the chip metallization section 23 may be equal to zero.

Figure 5:
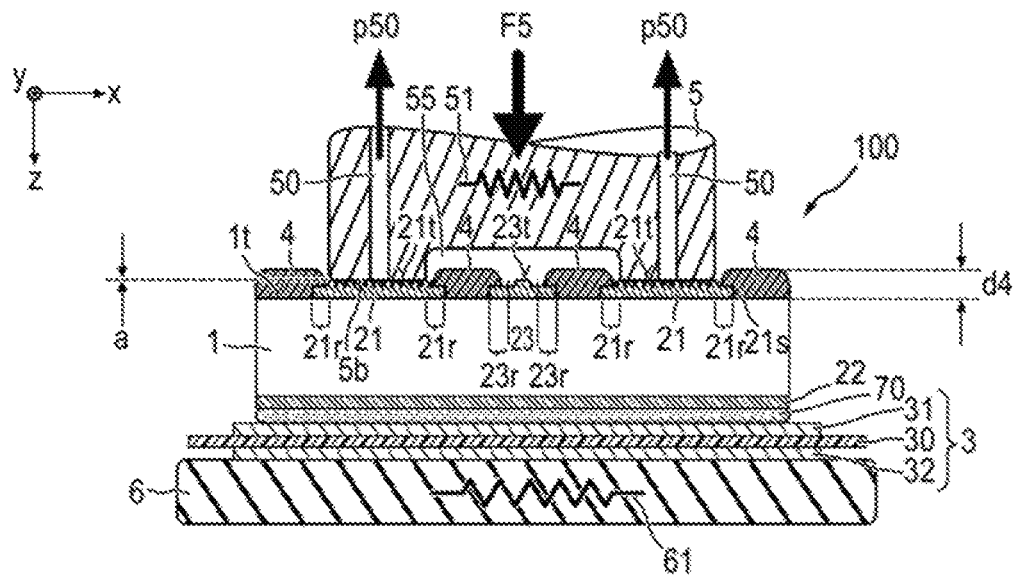
FIG. 5 shows an arrangement, which corresponds to the arrangement according to FIG. 4C, during the pressing of the semiconductor chip onto a carrier, the application tool being modified in relation to the application tool according to FIG. 4C.

Another alternative configuration is shown by FIG. 5. This corresponds to the arrangement according to FIG. 4C, with the difference that in this case a pressing force is not introduced via the chip metallization section 23 (for example a gate line or a gate pad). In this case, the distance a between the application tool 5 and the chip metallization section or sections 21 during the pressing may be equal to zero, while the application tool 5 may be separated from the chip metallization section or sections 23 during the pressing.

Figure 6:
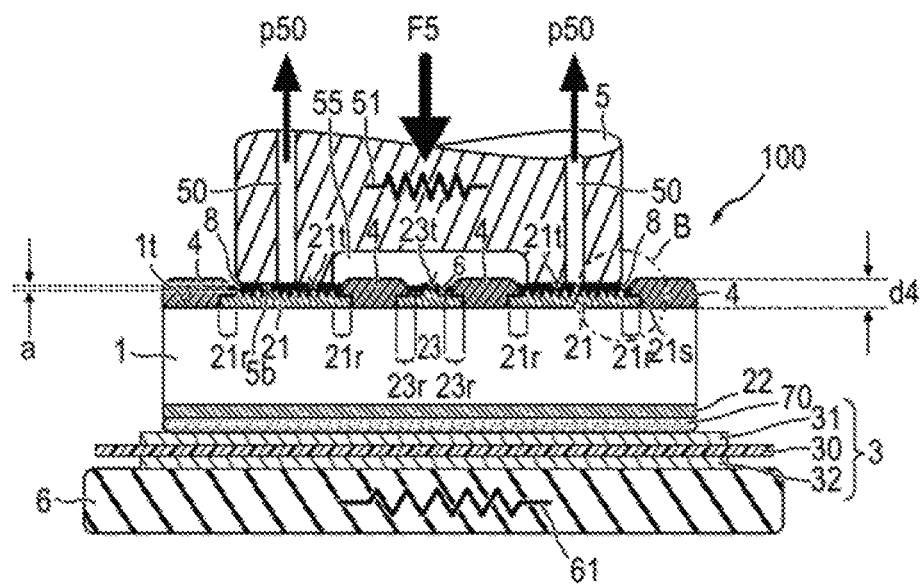
FIG. 6 shows an arrangement, which corresponds to the arrangement according to FIG. 5 with the difference that a protective layer, against which the application tool presses while it is pressing the semiconductor chip against the carrier, is applied onto at least one of the continuous chip metallization sections applied onto the top side of the semiconductor body.

FIG. 6 shows yet another configuration, which corresponds essentially to the configuration according to FIG. 5 but with the difference that a protective layer 8, which protects the relevant metallization sections 21, 23, for example from oxidation is furthermore applied to the top sides 21t and/or 23t, facing away from the semiconductor body 1, of the chip metallization sections 21 or 23, respectively. The induction, coming from the application tool 5, of the pressing force F5 onto the semiconductor chip 100 is therefore carried out not directly onto one or more upper chip metallization sections 21, 23, but indirectly via the protective layer 8. Such a protective layer 8 may, of course, also be applied onto the top side 21t, facing away from the semiconductor body 1, of the metallization section 21 of the semiconductor chip 100 according to FIG. 1A, specifically throughout the entire method until the application tool 5 is removed from the semiconductor chip (FIG. 1D). The materials for such a protective layer 8 are in principle arbitrary. They may be electrically conductive (for example metallic) or dielectric. Suitable materials are, for example, silicon nitride or aluminum oxide.

Since, during the pressing, the protective layer 8 is arranged between the application tool 5 on the one hand and the upper chip metallization section or sections 21, 23 on the other hand, the application tool 5 can be separated during the pressing from one, several or all of the chip metallization sections 21, 23 during the pressing and have a maximum distance a respectively from them. The maximum distance a may, for example, be selected to be less than or equal to 1 µm.

Figure 7:
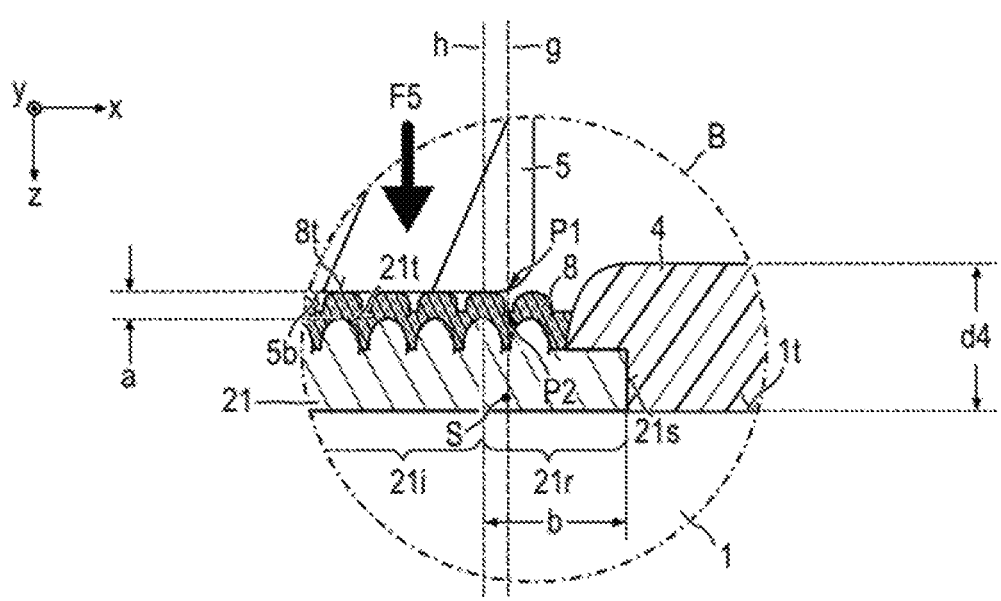
FIG. 7 shows an enlarged section B of the arrangement according to FIG. 6 during the pressing of the semiconductor chip onto the carrier.

FIG. 7 shows an enlarged section B of the arrangement according to FIG. 6. Apart from the additional protective layer 8, the conditions here are as in the arrangement according to FIG. 2.

The chip metallization section 21 comprises an annularly closed edge section 21r. In each direction perpendicular to the pressing direction z, for example the x and y directions represented, but also in any other direction that can be represented in the x-y plane, the edge section 21r has a minimum width b of more than zero. This may, for example, be at least 100 µm or even at least 200 µm in each direction perpendicular to the pressing direction. In order to avoid damage to the passivation 4 in the regions above the edge section 21r, expressed simply, at no position S of the edge section 21r is a pressing force, coming from the application tool 5, transmitted along a continuous straight portion extending parallel to the pressing direction z during the pressing.

Expressed another way, for each position S of the annularly closed edge section 21r, during the pressing a straight line g which extends through this position S in the pressing direction z comprises a portion [P1; P2] which does not extend through a solid body. Because the portion [P1; P2] does not extend through a solid body, there is no pressing force transmitted in a straight line in the pressing direction z onto the position S, i.e. no pressing force transmitted continuously along the straight line g between the application tool 5 and the position S. In this way, the occurrence of an undesirably high application of force to the semiconductor chip 100 in the region of the edge section 21r is thus avoided during the pressing. In particular, the passivation 4 is therefore prevented from being loaded with pressure in its particularly sensitive regions above the edge section 21r, and thereby being damaged.

As can be seen in FIG. 7, the starting point P1 of the portion [P1; P2] lies where the straight line g extending parallel to the pressing direction z through the position S intersects the bottom side 5b of the application tool 5. The endpoint P2 of the portion [P1; P2] lies at the position where the straight line g intersects the top side 8t, facing away from the semiconductor body 1, of the protective layer 8.

On the other hand, as in the arrangement without a protective layer 8 (FIG. 2), in the inner region 21i, transmission of the pressing force in a straight line from the application tool 5 to the chip metallization section 21 is permissible. Such force transmission in a straight line is likewise represented in FIG. 7. A straight line h extends parallel to the pressing direction z through a position of the top side 8t at which the bottom side 5b of the application tool 5 bears directly on the protective layer 8. At this position, the pressing force coming from the application tool 5 and acting in the pressing direction z is transmitted onto the chip metallization section 21 indirectly via the protective layer 8, specifically along a straight portion parallel to the pressing direction z. The same applies for other positions at which the bottom side 5t of the application tool 5 bears on the top side 8t of the protective layer 8.

Figure 8:
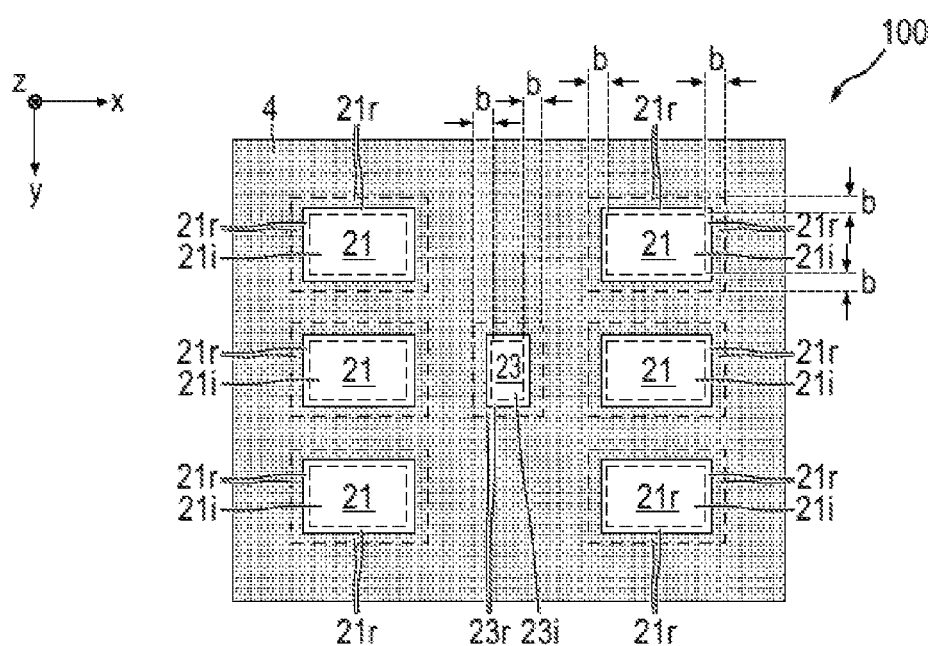
FIG. 8 shows a plan view of the semiconductor chip according to FIG. 4C.

FIG. 8 shows another plan view of the semiconductor chip 100 according to FIG. 5. The application tool, the carrier 3 and the backing holder 6 are not represented in this view. As can be seen, on the top side 1t of the semiconductor chip 100 there are a plurality of (here merely by way of example six) chip metallization sections 21, as well as one chip metallization section 23 (for example a gate pad). Each of these chip metallization sections 21 and 23 comprises an annularly closed edge section 21r and 23r, respectively, each of which is represented by two dashed lines. In each case, the outer edge of such an edge section 21r or 23r (the outer edges respectively represented by the outer dashed line) is fully covered by the passivation 4. During the pressing, the pressing force respectively acts only on an inner section 21i or 23i of the relevant chip metallization section 21 or 23, respectively, which lies inside the associated annular edge section 21r or 23r of the relevant chip metallization section 21 or 23, respectively.

Figure 9:
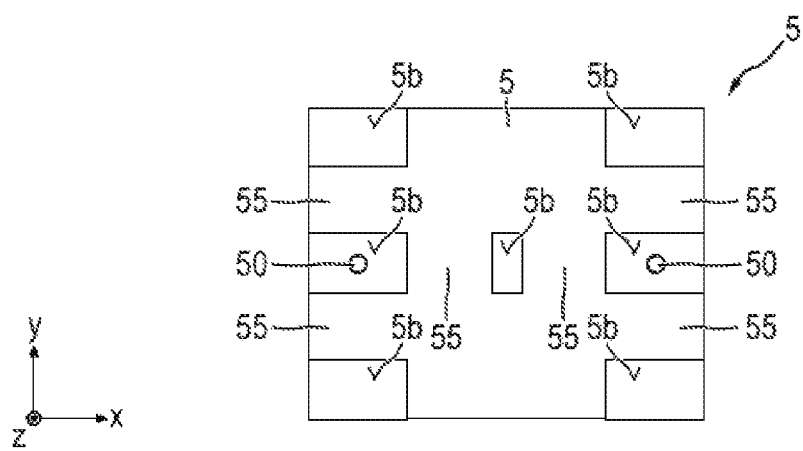
FIG. 9 shows a view of the bottom side of the application tool according to FIG. 4C.

FIG. 9 furthermore shows the bottom side 5b of an application tool 5 suitable for pressing the semiconductor chip 100 according to FIG. 8. Here, it can be seen that an application tool 5 may comprise not only one but also two or more recesses 55 on its bottom side 5b.

In the method explained above, the application tool 5 as a whole, or at least its bottom side 5b, may for example be formed from metal, or from a plastic. In general, an application tool 5 may be configured in such a way that it, or at least its bottom side 5b, is thermally stable at temperatures of up to at least 300° C.

The upper chip metallization sections 21, 23 (if present) may be formed from a metal layer, or from two or more metal layers consisting of different materials. The top sides, facing away from the semiconductor body 1, of the upper chip metallization sections 21, 23 may, for example, be formed by aluminum or an aluminum alloy, by copper or a copper alloy, or by nickel or a nickel alloy.

In the present invention, the application tool 5 may be configured in such a way that the pressing force F5 acts essentially only on the active chip regions (i.e. on the regions below the inner chip metallization sections 21i or 23i, respectively), but not on the inactive chip regions. This can be achieved by the geometry of the bottom side 5b of the application tool 5 corresponding approximately to the base area of the active chip regions, the application tool 5 comprising, in all inactive chip regions, recesses 55 which are dimensioned in such a way that the application tool 5 does not transmit any force onto the semiconductor chip 100 in the region of the recesses 55 during the pressing. In particular, the application tool 5 may be configured in such a way that it does not press directly against the passivation 4 during the pressing.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for positioning a semiconductor chip on a carrier, the semiconductor chip comprising a semiconductor body having a bottom side and a top side opposite the bottom side, and passivation arranged on the top side, the method comprising:

picking the semiconductor chip and placing the semiconductor chip on the carrier; and pressing the semiconductor chip onto the carrier by a pressing force in a pressing direction, such that the pressing force acts on the semiconductor chip only above one or more continuous chip metallization sections arranged on the top side, each of the one or more continuous chip metallization sections comprising an annularly closed edge section which has a minimum width of more than zero in each direction perpendicular to the pressing direction, and the pressing force not acting on the semiconductor chip above the annularly closed edge section.

2. The method of claim 1, wherein the passivation has a thickness of at least 10 μm in the pressing direction during the pressing.

3. The method of claim 1, wherein the passivation comprises an imide or a polyimide.

4. The method of claim 1, wherein the pressing force is at least 1 N.

5. The method of claim 4, wherein the pressing force is at least 5 N.

6. The method of claim 1, wherein the minimum width is equal to 100 μm.

7. The method of claim 6, wherein the minimum width is equal to 200 μm.

8. The method of claim 1, wherein the picking of the semiconductor chip and the placement of the semiconductor chip on the carrier is carried out with the aid of an application tool, wherein the bottom side faces toward the carrier after the placement of the semiconductor chip on the carrier, and wherein the top side faces toward the application tool after the placement of the semiconductor chip on the carrier.

9. The method of claim 8, wherein, for each position of the annularly closed edge section, during the pressing a straight line which extends through that position in the pressing direction comprises a portion which does not extend through a solid body.

10. The method of claim 8, wherein the application tool comprises a recess in which a section of the passivation engages during the pressing.

11. The method of claim 10, wherein the recess has a depth of at least 0.3 mm parallel to the pressing direction.

12. The method of claim 8, wherein the application tool is separated by no more than 1 μm from each of the continuous chip metallization sections arranged on the top side during the pressing.

13. The method of claim 8, wherein the application tool does not touch any dielectric of the semiconductor chip during the pressing.

14. A method for the bonding of a semiconductor chip to a carrier, the method comprising:

positioning a semiconductor chip on a carrier; and pressing the semiconductor chip onto the carrier by a pressing force in a pressing direction, such that the pressing force acts on the semiconductor chip only above one or more continuous chip metallization sections arranged on a top side of the semiconductor chip, each of the one or more continuous chip metallization sections comprising an annularly closed edge section which has a minimum width of more than zero in each direction perpendicular to the pressing direction, and the pressing force not acting on the semiconductor chip above the annularly closed edge section, wherein the placement of the semiconductor chip on the carrier is carried out in such a way that a bonding agent layer is arranged between a bottom side of the semiconductor chip and the carrier after the placement and during the pressing.

15. The method of claim 14, wherein the bonding agent layer comprises a solder and is heated during the pressing to temperatures which are higher than a temperature at which the solder melts.

16. The method of claim 14, wherein the bonding agent layer comprises a metal powder and is heated during the pressing to temperatures which are higher than a temperature at which the metal powder is sintered.

17. The method of claim 14, wherein the bonding agent layer is applied onto the bottom side or onto the carrier before the placement of the semiconductor chip on the carrier.

18. The method of claim 14, wherein before the placement of the semiconductor chip on the carrier, a first bonding agent sublayer is applied onto the bottom side and a second bonding agent sublayer is applied onto the carrier, and wherein the first bonding agent sublayer and the second bonding agent sublayer are combined to form the bonding agent layer by the placement of the semiconductor chip on the carrier.

19. The method of claim 14, wherein the pressing of the semiconductor chip onto the carrier is carried out indirectly via the bonding agent layer.

20. The method of claim 14, wherein the bonding agent layer extends continuously from the bottom side to the carrier during the pressing of the semiconductor chip onto the carrier.

* * * * *